US009515624B2

(12) United States Patent
Nakagomi (10) Patent No.: US 9,515,624 B2
(45) Date of Patent: Dec. 6, 2016

(54) SEMICONDUCTOR DEVICE (71) Applicant: FUJI ELECTRIC CO., LTD., Kawasaki-shi (JP)

(72) Inventor: Kenji Nakagomi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 118 days.

(21) Appl. No.: 14/250,831

(22) Filed: Apr. 11, 2014

(65) Prior Publication Data

US 2014/0306759 A1 Oct. 16, 2014

(30) Foreign Application Priority Data

Apr. 16, 2013 (JP) ................................ 2013-085657

(51) Int. Cl.
*H03F 3/45* (2006.01)
(52) U.S. Cl.
CPC ...... *H03F 3/45744* (2013.01); *H03F 3/45183* (2013.01); *H03F 2203/45212* (2013.01)
(58) Field of Classification Search
CPC ................................................. H03F 3/45071
USPC ................................................ 330/252–261
See application file for complete search history.

(56) References Cited

U.S. PATENT DOCUMENTS

| | | | | |
|---|---|---|---|---|
| 6,693,491 B1* | 2/2004 | Delano | ................ | H03G 1/0088 330/254 |
| 6,967,526 B1* | 11/2005 | Churchill | ............ | H03F 3/45085 330/256 |
| 7,126,419 B2* | 10/2006 | Miyasita | ............. | H03F 3/45085 330/69 |
| 8,736,369 B2* | 5/2014 | Petrie | ........................ | H03F 3/45 330/253 |

FOREIGN PATENT DOCUMENTS

JP 2012-244558 A 12/2012
JP 2012-246736 A 12/2012

* cited by examiner

*Primary Examiner* — Khanh V Nguyen
*Assistant Examiner* — Khiem Nguyen
(74) *Attorney, Agent, or Firm* — Rabin & Berdo, P.C.

(57) ABSTRACT

A differential amplifier includes a differential circuit section, a gain circuit section amplifying the output of the differential circuit section and outputting the amplified output, and an offset voltage adjusting circuit section carrying out an adjustment so that a voltage equal to the offset voltage of the differential circuit section is added to the input voltage applied across a pair of input terminals and giving the adjusted voltage to the differential circuit section. The offset voltage adjusting circuit section includes a differential pair formed of a pair of MOS-FETs, a MOS-FET forming the load of the differential pair, and two resistor elements each corresponding to one of the MOS-FETs of the differential pair and the load, and giving a voltage equal to the offset voltage to the differential pair. This provides a differential amplifier suitable for detecting the output current of the zero-phase current transformer in an earth leakage breaker.

11 Claims, 6 Drawing Sheets

SEMICONDUCTOR DEVICE

BACKGROUND OF INVENTION

1. Field of the Invention

The present invention relates to a differential amplifier suitable for detecting an output current of a zero-phase current transformer in an earth leakage breaker and to an earth leakage breaker formed with the differential amplifier provided.

2. Background Art

Figure 5:
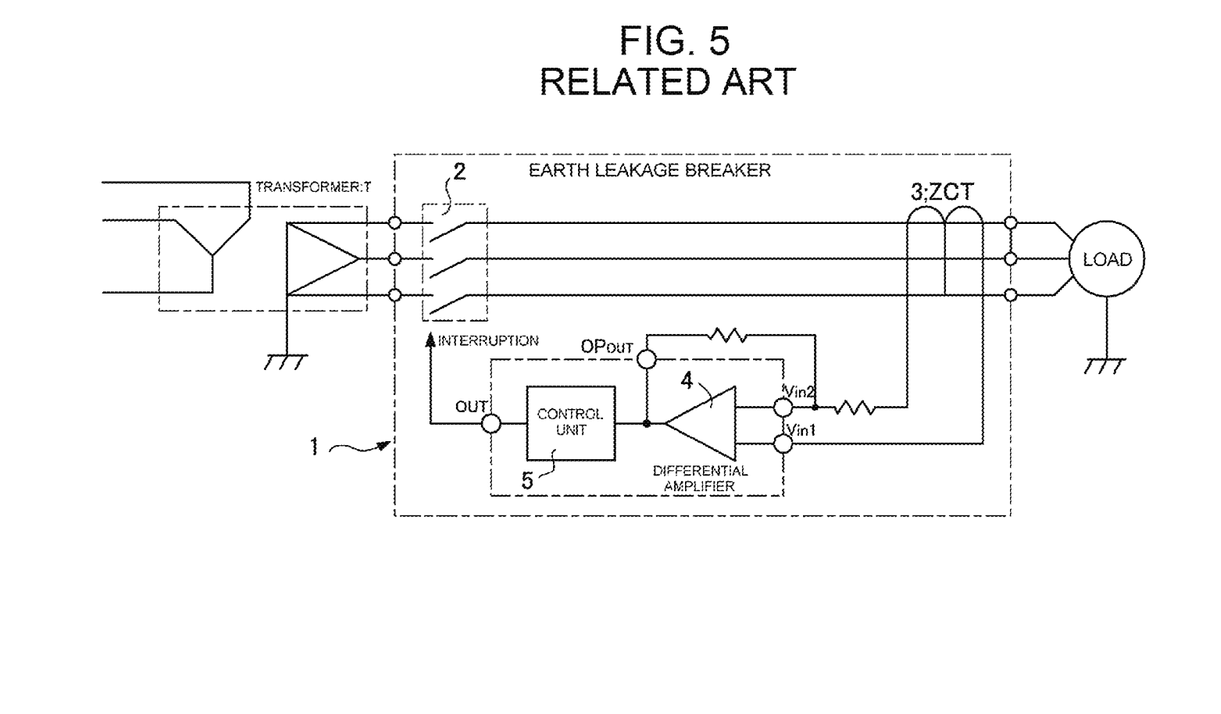
FIG. 5 is a circuit diagram schematically showing an example of a typical configuration of an earth leakage breaker.

FIG. 5 is a circuit diagram schematically showing an example of a typical configuration of an earth leakage breaker. As is shown in FIG. 5, an earth leakage breaker 1 is provided with an interrupter switch 2, a zero-phase current transformer (ZCT) 3, a differential amplifier 4 and a control unit 5. The interrupter switch 2 is inserted in an AC power supply line into which an AC power supply voltage Vac is supplied through a transformer T. The zero-phase current transformer 3 is further inserted in the AC power supply output line into which the interrupter switch 2 is inserted. The differential amplifier 4 amplifies a current detected through the zero-phase current transformer 3. The control unit 5 monitors the output voltage of the differential amplifier 4 to detect ground leakage on the AC power supply output line side. Namely, the control unit 5, when the monitored output voltage of the differential amplifier 4 becomes high (when the output current of the zero-phase current transformer 3 becomes large), determines that earth leakage occurs on the AC power supply output line side to drive the interrupter switch 2 to thereby interrupt the input of the AC power supply voltage Vac (see JP-A-2012-246736, for example).

Figure 6:
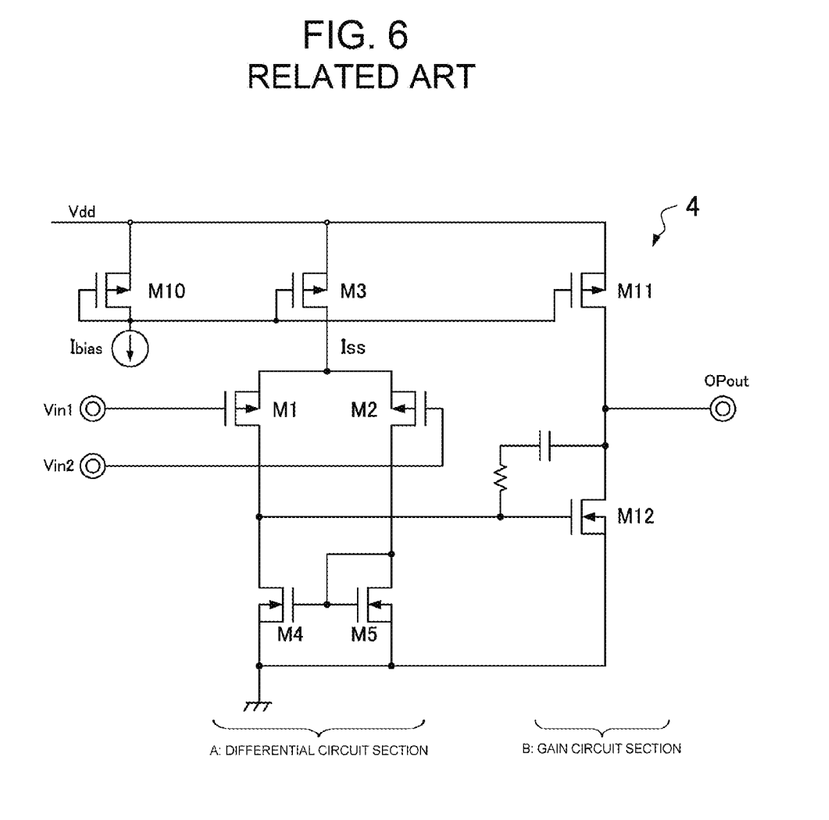
FIG. 6 is a circuit diagram schematically showing an example of the configuration of a related typical differential amplifier used in an earth leakage breaker.

FIG. 6 is a circuit diagram schematically showing an example of the configuration of the related typical differential amplifier 4 used in the earth leakage breaker 1. The differential amplifier 4 is formed with a differential circuit section A and a gain circuit section B provided. The differential circuit section A carries out the differential amplification of voltages Vin1 and Vin2 applied to a pair of voltage input terminals, respectively. The gain circuit section B amplifies the output of the differential circuit section A and outputs an amplified output voltage OPout with a specified voltage level. Incidentally, the differential circuit section A is formed of a first transistor M1 and a second transistor M2 forming a first differential pair, a third transistor M3 forming a current source of the first differential pair, and a fourth transistor M4 and a fifth transistor M5 forming a current mirror circuit to be active loads of the first differential pair.

Specifically, each of the first transistor M1, second transistor M2 and third transistor M3 is formed of, for example, a p-channel MOS-FET (hereinafter abbreviated as P-MOS). Each of the fourth transistor M4 and fifth transistor M5 is formed of, for example, an n-channel MOS-FET (hereinafter abbreviated as N-MOS). The third transistor M3 is operated with the gate voltage thereof being applied by a tenth transistor (P-MOS) M10 driven by a constant current source Ibias. The third transistor M3 plays a role of supplying a constant tail current Iss to the first differential pair of the transistor M1 and transistor M2.

The gain circuit section B is formed of a transistor (N-MOS) M12 in common-source connection. The transistor M12, with a transistor (P-MOS) M11 as a load, for example, connected to the drain thereof, has a voltage, produced at the drain of the transistor M1 forming the first differential pair, inputted to the gate thereof and carries out inverted amplification of the inputted voltage. The transistor M11, with the gate voltage thereof applied by the tenth transistor M10, operates as the load of the transistor M12. The differential amplifier 4 with such a configuration is as is presented in detail in JP-A-2012-244558, for example.

Patent Document 1: JP-A-2012-246736
Patent Document 2: JP-A-2012-244558

Incidentally, from the view point of preventive maintenance and stability in supply of power, the development of an earth leakage breaker 1 is being carried out which is provided with functions of detecting a state of exhibiting any sign preceding earth leakage, a state in which the change in the level of the output current of the zero-phase current transformer 3 becomes 30% of the earth leakage level, for example, and giving an alarm to attract attention. In the earth leakage breaker 1 of this kind, it is required that not only is the detection accuracy in the zero-phase current transformer 3 improved, but the sensitivity (input detection sensitivity) of the differential amplifier 4 is increased to three times or more, for example.

However, in the related differential amplifier 4 with the configuration shown in FIG. 6, an input offset voltage ΔVin, which is a difference between the voltages Vin1 and Vin2 remaining across a pair of the voltage input terminals when the output voltage OPout is made to be zero, is generally on the order of 10 mV max. This is larger than the detected voltage (output voltage) of the zero-phase current transformer 3 in the state of change in 30% of the earth leakage level. Incidentally, for detecting the detected voltage (output voltage) of the zero-phase current transformer 3 in the state of change in 30% of the earth leakage level, it is necessary to reduce the input offset voltage ΔVin in the related differential amplifier 4 to the order of 2 mV max, for example. Thus, there is a problem in that in the earth leakage breaker 1 formed by using the related differential amplifier 4, it is difficult to detect the state of change in 30% of the earth leakage level explained in the foregoing.

The invention was made with such a situation taken into consideration and it is an object of the invention to provide a differential amplifier which is capable of detecting the state of change in 30% of the earth leakage level with high accuracy and an earth leakage breaker formed by using the differential amplifier and excellent in preventive maintenance and stability in supply of power.

SUMMARY OF THE INVENTION

For achieving the object explained in the foregoing, a differential amplifier according to the invention is characterized by including a pair of input terminals, a differential circuit section carrying out differential amplification of voltages given in a pair, a gain circuit section amplifying the output of the differential circuit section and outputting the amplified output, and an offset voltage adjusting circuit section inserted between the differential circuit section and a pair of the input terminals, the offset voltage adjusting circuit section carrying out an adjustment so that a voltage equal to the offset voltage of the differential circuit section is added to the input voltage applied across a pair of the input terminals and giving the adjusted voltage to the differential circuit section.

The differential circuit section is preferably formed by including first and second transistors forming a first differential pair, a third transistor forming a current source of the first differential pair, and fourth and fifth transistors forming a current mirror circuit to be an active load of the first differential pair.

The offset voltage adjusting circuit section is formed by including sixth and seventh transistors forming a second differential pair, an eighth transistor forming a current source of the second differential pair, a ninth transistor forming a load of the second differential pair, a first resistor element inserted between the sixth transistor forming one of the second differential pair and the load, and a second resistor element inserted between the seventh transistor forming the other one of the second differential pair and the load, the first and second resistor elements giving a voltage equal to the offset voltage of the differential circuit section to the second differential pair.

The offset voltage adjusting circuit section may include a series connection of a plurality of resistor elements inserted between the sixth transistor and the seventh transistor with the resistance value of the connection equal to the sum of the resistance value of the first resistor element and the resistance value of the second resistor element, and a plurality of switches connected to the connection points in the series connection to divide the series connection into the region equivalent to the first resistor element and the region equivalent to the second resistor element at the specified connection point of the connection points in the series connection and, along with this, selectively connecting the connection point to the ninth transistor forming the load. Thus, the first resistor element and the second resistor element are formed. A plurality of the switches are formed of a plurality of transistors selectively turned on and turned off by external switches.

Incidentally, the external switches may be a plurality of ON-OFF changeover switches which are capable of being preset, for example, or may be a plurality of external terminals which can be grounded by selective soldering.

Each of the first, second, third, sixth, seventh and eighth transistors is formed of a P-channel MOS-FET, and each of the fourth, fifth and ninth transistors and a plurality of the transistors forming a plurality of the switches is formed of an N-channel MOS-FET. As an alternative, each of the first, second, third, sixth, seventh and eighth transistors is formed of an N-channel MOS-FET, and each of the fourth, fifth and ninth transistors and a plurality of the transistors forming a plurality of the switches is formed of a P-channel MOS-FET.

According to the differential amplifier with the foregoing configuration, a voltage equal to the input offset voltage of the differential circuit section is added to the input voltage of the differential amplifier by the offset voltage adjusting circuit section to thereby make it possible to cancel the influence of the input offset voltage on the output of the differential circuit section. Thus, the apparent sensitivity (input detection accuracy) of the differential circuit section can be increased. Therefore, the substantial sensitivity (input detection sensitivity) of the differential amplifier can be increased to three times or more, for example, of the sensitivity of a related ordinary differential amplifier. Consequently, according to the earth leakage breaker formed with the use of the differential amplifier, it becomes possible to detect the state of change in 30% of the earth leakage level with high accuracy, by which a considerable practical advantage can be achieved in securing functions of preventive maintenance and stability in supply of power.

DETAILED DESCRIPTION

In the following, differential amplifiers according to embodiments of the invention and an earth leakage breaker formed by using the differential amplifier will be explained with reference to attached drawings.

The differential amplifier according to the invention is one fundamentally suitable for being used as the differential amplifier 4 in the earth leakage breaker 1 shown in FIG. 5. Namely, the differential amplifier according to the invention has a high sensitivity (input detection accuracy) suitable for amplifying the output voltage of the zero-phase current transformer 3 in the earth leakage breaker 1 and giving the amplified voltage to the control unit 5. Thus, the differential amplifier actualizes the preventive maintenance and stability in supply of power required for the earth leakage breaker 1.

Figure 1:
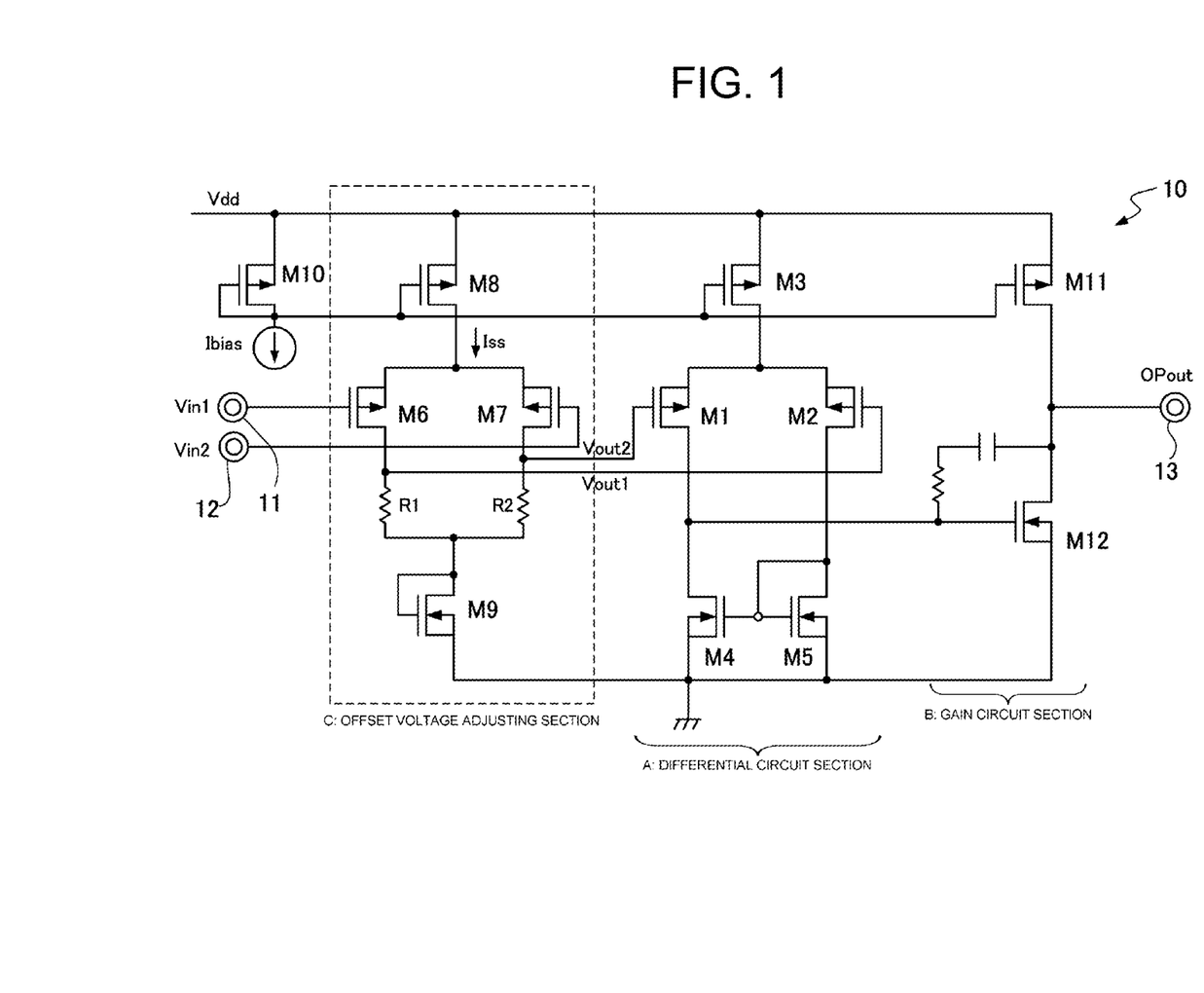
FIG. 1 is a circuit diagram schematically showing the configuration of a differential amplifier according to a first embodiment of the invention.

FIG. 1 is a circuit diagram schematically showing the configuration of a differential amplifier 10 according to a first embodiment of the invention. In FIG. 1, the same parts as those in the differential amplifier 4 shown in FIG. 6 are denoted with the same reference numerals and signs. Therefore, their redundant explanations will be omitted.

The differential amplifier 10 is basically provided with a differential circuit section A and a gain circuit section B. The differential circuit section A carries out differential amplification of voltages given in a pair. The gain circuit section B amplifies the output of the differential circuit section A to output the amplified output. The differential amplifier 10 is further provided with an offset voltage adjusting circuit section C. The offset voltage adjusting circuit section C is inserted between the differential circuit section A and a pair of input terminals 11 and 12 and carries out adjustment so as to add a voltage with a magnitude being equal to that of the input offset voltage in the differential circuit section A to the differential voltage between input voltages Vin1 and Vin2 applied to a pair of the input terminals 11 and 12, respectively, before giving the adjusted voltage to the differential circuit section A.

Namely, the differential amplifier 10 according to the invention is characterized by a configuration provided so that the input voltages Vin1 and Vin2 are inputted to the offset voltage adjusting circuit section C as is shown in FIG. 1 and the output voltages Vout1 and Vout2 of the offset voltage adjusting circuit section C are inputted to the differential circuit section A. In addition, the differential amplifier 10 is characterized by the addition of an offset voltage $\Delta V$ ($=-\Delta Vin$) to the differential voltage between the input voltages Vin1 and Vin2, by which the influence of an input offset voltage $\Delta Vin$ on the output of the differential circuit section A is cancelled. Incidentally, the related differential amplifier 4 has such a configuration that input voltages Vin1 and Vin2 applied to a pair of the input terminals 11 and 12, respectively, are directly inputted to the differential circuit section A.

The offset voltage adjusting circuit section C will be specifically explained. The offset voltage adjusting circuit section C is provided with a sixth transistor M6 and a seventh transistor M7 forming a second differential pair, an eighth transistor M8 forming the current source of the second differential pair, a ninth transistor M9 forming the load of the second differential pair, and further a first resistor element R1 and a second resistor element R2 inserted between the second differential pair and the ninth transistor M9 forming the load for giving a voltage offset to the second differential pair.

Each of the sixth transistor M6 to the eighth transistor M8 is formed of a P-MOS, for example, and the ninth transistor M9 is formed of an N-MOS, for example. Moreover, the eighth transistor M8 is operated with the gate voltage thereof applied by the tenth transistor M10 driven by the constant current source Ibias. The eighth transistor M8 is further plays a role of supplying a constant tail current Iss to the second differential pair formed of the sixth transistor M6 and the seventh transistor M7.

Here, let the sixth transistor M6 and the seventh transistor M7 forming the second differential pair be symmetrically arranged on a semiconductor integrated circuit with identical dimensions and have identical characteristics. In this case, the threshold voltages Vt of the sixth transistor (P-MOS) M6 and the seventh transistor M7 (P-MOS) are equal to each other and the currents I6 and I7 flowing in the sixth transistor M6 and the seventh transistor M7, respectively, become $$I6=(\beta/2)\cdot(Vgs6-Vt)^2$$

and $$I7=(\beta/2)\cdot(Vgs7-Vt)^2$$

where β is given as $$\beta=(W/L)\cdot\mu p\cdot Cox.$$

Here, Vgs6 and Vgs7 are the gate-source voltages of the sixth transistor M6 and the seventh transistor M7, respectively, and (W/L) is an index indicating the dimension of each of the sixth transistor M6 and the seventh transistor M7 specified by the channel width W and the channel length L of each of the sixth transistor M6 and the seventh transistor M7. Moreover, μp is the hole mobility and Cox is the gate capacitance per unit area of each of the sixth transistor M6 and the seventh transistor M7. The sum of the currents I6 and I7 is equal to the tail current Iss (I6+I7=Iss).

Accordingly, if we let the input voltages Vin1 and Vin2 applied to a pair of the input terminals 11 and 12, respectively, be equal to each other (Vin=Vin1=Vin2), the drain-source voltages Vds6 and Vds7 of the sixth transistor M6 and the seventh transistor M7, respectively, become $$Vds6=\{Vt+(2\cdot I6/\beta)^{1/2}\}-(Vin-Vout1)$$

and $$Vds7=\{Vt+(2\cdot I7/\beta)^{1/2}\}-(Vin-Vout2).$$

Moreover, letting the threshold voltage of the ninth transistor M9 forming the load be represented as Vth9, the source voltage Vs6 of the sixth transistor M6 and the source voltage Vs7 of the sixth transistor M7 become $$Vs6=Vth9+(I6\cdot r1)-Vds6$$

and $$Vs7=Vth9+(I7\cdot r2)-Vds7$$

where r1 and r2 represent resistance values of the first resistor element R1 and the second resistor element R2, respectively.

Accordingly, when the input voltages Vin1 and Vin2 are equal to each other, the voltage ΔV produced between the output voltages Vout1 and Vout2 of the offset voltage adjusting circuit section C can be provided as $$\Delta V = Vout1 - Vout2$$
$$= (I7\cdot r2 - I6\cdot r1) + (2\cdot\beta)^{1/2}\cdot\{(I7)^{1/2} - (I6)^{1/2}\}.$$

Here, as was explained in the foregoing, in order that the sum of the currents I6 and I7 is equal to the tail current Iss (I6+I7=Iss), the sum of the resistance values of r1 and r2 of the first resistor element R1 and the second resistor element R2, respectively, is made to be constant value r (r1+r2=r). Therefore, by determining the resistance value r1 (or r2) of one of the first resistor element R1 and the second resistor element R2, the resistance value r2 (or r1) of the other resistor element R2 (or R1) is uniquely determined.

Thus, the resistance values r1 and r2 of the first resistor elements R1 and the second resistor element R2, respectively, are made to be determined beforehand so that the voltage ΔV, produced between the output voltages Vout1 and Vout2 of the offset voltage adjusting circuit section C when the input voltages Vin1 and Vin2 are equal to each other, comes to be related to the input offset voltage ΔVin of the differential circuit section A and the gain circuit section B as $$\Delta V=-\Delta Vin.$$

As a result, it becomes possible to cancel the influence of the input offset voltage ΔVin on the differential circuit section A and the gain circuit section B by the offset voltage adjusting circuit section C. Therefore, the input offset voltage ΔVin of the whole differential amplifier 10 can be made to be zero (0) volt or considerably reduced to be made 2 mVmax.

In other words, by producing a voltage ΔV, which is equivalent to the input offset voltage ΔVin in the differential circuit section A, in the offset voltage adjusting circuit section C as ΔV=−ΔVin, it becomes possible to reduce the input offset voltage ΔVin of the whole differential amplifier 10 down to 2 mVmax or preferably to zero (0) volt. Therefore, according to the earth leakage breaker 1 using the differential amplifier 10, which is formed by providing the offset voltage adjusting circuit section C, as the differential amplifier 4, the input offset voltage of the differential amplifier 10 is as low as 2 mVmax and thus the detection sensitivity thereof is high. This makes it possible to detect the output voltage of the zero-phase current transformer 3 with a high accuracy.

Thus, according to the earth leakage breaker 1 formed by providing the differential amplifier 10, the sensitivity of the differential amplifier 10 is sufficiently high compared with the output voltage of the zero-phase current transformer 3. Hence, even though the output voltage of the zero-phase current transformer 3 is on the order of 2 mV, the output voltage can be amplified with a high accuracy. As a result, it becomes possible to detect the foregoing state of 30% of the earth leakage level with a high accuracy. Therefore, a considerable practical advantage can be achieved in securing functions of preventive maintenance and stability in supply of power which functions are required for the earth leakage breaker 1.

Figure 2:
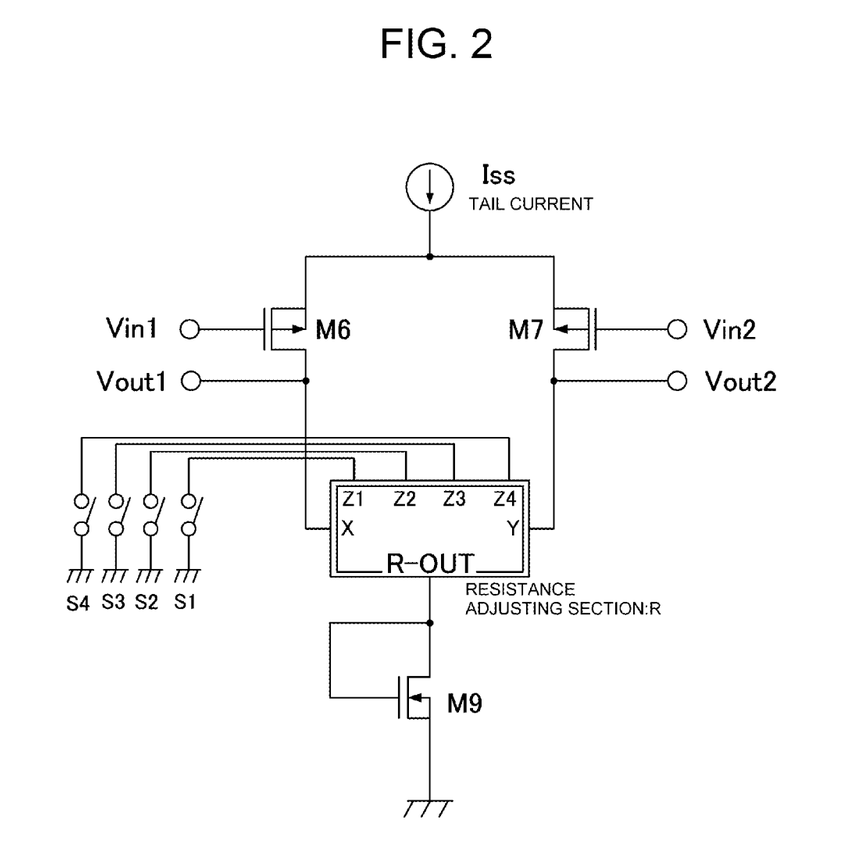
FIG. 2 is a circuit diagram schematically showing the configuration of an offset voltage adjusting circuit section in a differential amplifier according to a second embodiment of the invention.

The first resistor element R1 and the second resistor element R2 giving a voltage offset to the second differential pair is practically actualized as a resistance adjusting section R as is shown in FIG. 2, a circuit diagram schematically showing the configuration of an offset voltage adjusting circuit section C in a differential amplifier according to a second embodiment of the invention, and is incorporated into the offset voltage adjusting circuit section C. The resistance adjusting section R is provided with a series connection of a plurality of resistor elements which are inserted between the sixth transistor M6 and seventh transistor M7 forming the second differential pair. The series connection has a resistance value equal to the sum of the resistance values of the first resistor element R1 and the second resistor element R2. By the selective turning on and turning off of external switches S1 to S4, for example, one of the connection points in the series connection of a plurality of the resistor elements is selected so as to divide the series connection into the region equivalent to the first resistor element R1 and the region equivalent to the second resistor element R2 and form the first resistor element R1 and the second resistor element R2. Along with this, the selected connection point is connected to the ninth transistor M9 forming the load.

The external switches S1 to S4 may be changeover switches in a so-called dip switch formed of a plurality of ON-OFF changeover switches which can be preset, for example, or may be a plurality of external terminals which can be grounded by selective soldering.

In this way, the resistance adjusting section R is formed so that the series connection of a plurality of the resistor elements is divided into the region equivalent to the first resistor element R1 and the region equivalent to the second resistor element R2 at the connection point specified by the external switches S1 to S4 being set to be turned on, for example, and the region equivalent to the resistor element R1 is selectively inserted between the sixth transistor M6 forming one of the second differential pair and the ninth transistor M9 as the load and the region equivalent to the second resistor element R2 is selectively inserted between the seventh transistor M7 forming the other one of the second differential pair and the ninth transistor M9 as the load.

When the external switches S1 to S2 are formed of external terminals, the resistance adjusting section R is formed so that the series connection of a plurality of the resistor elements is divided into the region equivalent to the first resistor element R1 and the region equivalent to the second resistor element R2 at the connection point specified by the external terminals grounded by soldering, for example, and the region equivalent to the first resistor element R1 is selectively inserted between the sixth transistor M6 forming one of the second differential pair and the ninth transistor M9 as the load and the region equivalent to the second resistor element R2 is selectively inserted between the seventh transistor M7 forming the other one of the second differential pair and the ninth transistor M9 as the load.

Figure 3:
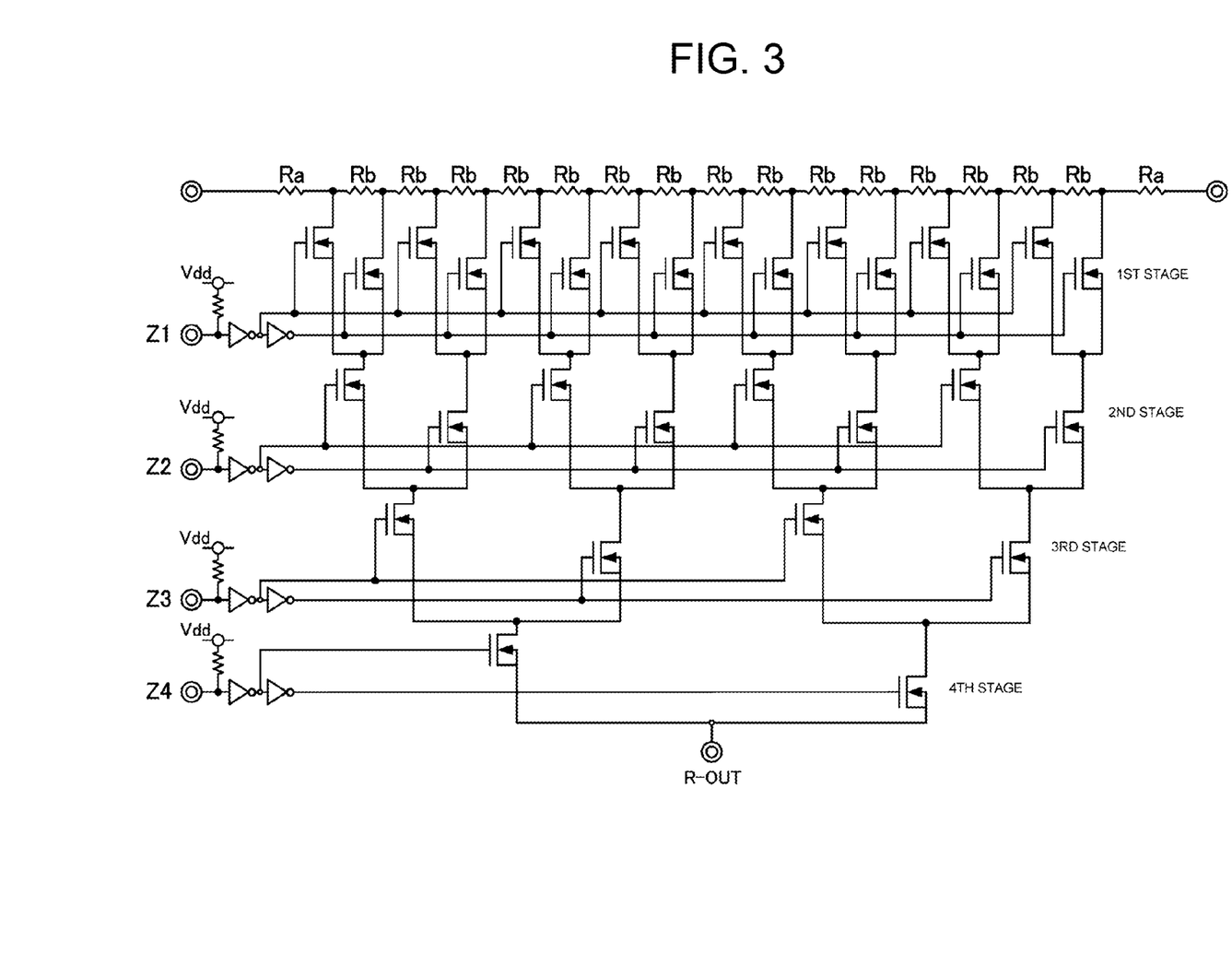
FIG. 3 is a circuit diagram schematically showing an example of the configuration of the resistance adjusting section in the offset voltage adjusting circuit section shown in FIG. 2.

Specifically, the resistance adjusting section R is, as is shown in, for example, FIG. 3 as a circuit diagram schematically showing an example of the configuration of the resistance adjusting section R in the offset voltage adjusting circuit section C shown in FIG. 2, provided with a series resistor circuit formed of two resistor elements Ra connected to their respective sources of the sixth transistor M6 and the seventh transistor M7 forming the second differential pair and fifteen resistor elements Rb inserted between the resistor elements Ra in series. Letting the resistance value of the resistor element Ra be ra and the resistance value of the resistor element Rb be rb, the resistance value 2ra+15rb of the series resistor circuit formed of the resistor elements Ra and Rb is determined as the sum r of the resistance value r1 of the first resistor element R1 explained in the foregoing and the resistance value r2 of the second resistor element R2 explained in the foregoing as $$r=r1+r2=2ra+15rb.$$

The resistance adjusting section R is provided with four stage switch groups. The first stage switch group is formed of sixteen N-MOSs provided in parallel to one another with each of drains thereof connected to its own connection point of the sixteen connection points in the series connection of the seventeen resistor elements including the two resistor elements Ra and the fifteen resistor elements Rb. The second stage switch group is formed of eight N-MOSs provided in parallel to one another with each of the drains thereof connected to the sources of every two of the sixteen N-MOSs in the first stage switch group. The third stage switch group is formed of four N-MOSs provided in parallel to one another with each of the drains thereof connected to the sources of every two of the eight N-MOSs in the second stage switch group. The fourth stage switch group is formed of two N-MOSs provided in parallel to one another with each of the drains thereof connected to the sources of every two of the four N-MOSs in the third stage switch group. Through the first to fourth stage switch groups, the source of the ninth transistor M9 as the load is selectively connected to any one of the connection points in the series connection of the seventeen resistor elements including the two resistor elements Ra and the fifteen resistor elements Rb in the series resistor circuit.

In a switch group in each of the first stage to fourth stage, a switch pair, which is operated so that when one switch is turned on, the other switch is turned off, is formed for every two adjacent switches (N-MOSS). For every two switch pairs, one switch pair is connected to one switch (N-MOS) in a switch pair in the next stage and the other switch pair is connected to the other switch in the switch pair in the next stage. With switch pairs in a stage connected to switch pairs in the next stage in this way, a so-called inverse pyramid switch circuit is formed.

In addition, the resistance adjusting section R inputs each of selection signals Z1, Z2, Z3 and Z4 as a switching control signal for the switch pairs in the switch group in its own one of the first, second, third and fourth stages. Each of the selection signals Z1, Z2, Z3 and Z4 is set by selective turning on and turning off of its own one of the external switches S1, S2, S3 and S4. Each of the selection signals Z1, Z2, Z3 and Z4 for its own stage is inputted to the gate of an N-MOS as one switch of each of the switch pairs in the switch group through an inverter and is also inputted to the gate of an N-MOS as the other switch of the switch pair through one more inverter with the polarity of the signal further inverted. This operates each of the switch pairs so that when one switch is turned on, the other switch is turned off.

Therefore, according to the resistance adjusting section R formed as is explained in the foregoing, it is possible to adjust the resistance value r1 of the first resistor element R1 and the resistance value r2 of the second resistor element R2 in steps of the resistance value rb of the resistor element Rb while meeting the requirement that the sum r of the resistance value r1 of the first resistor element R1 and the resistance value r2 of the second resistor element R2 becomes constant as r1+r2=r. By adjusting the resistance values r1 and r2 of the first resistor elements R1 and the second resistor element R2, respectively, in this way, it becomes possible to reduce the input offset voltage ΔVin down to 2 mVmax as was explained in the foregoing and increase the detection sensitivity of the differential amplifier 10.

Figure 4:
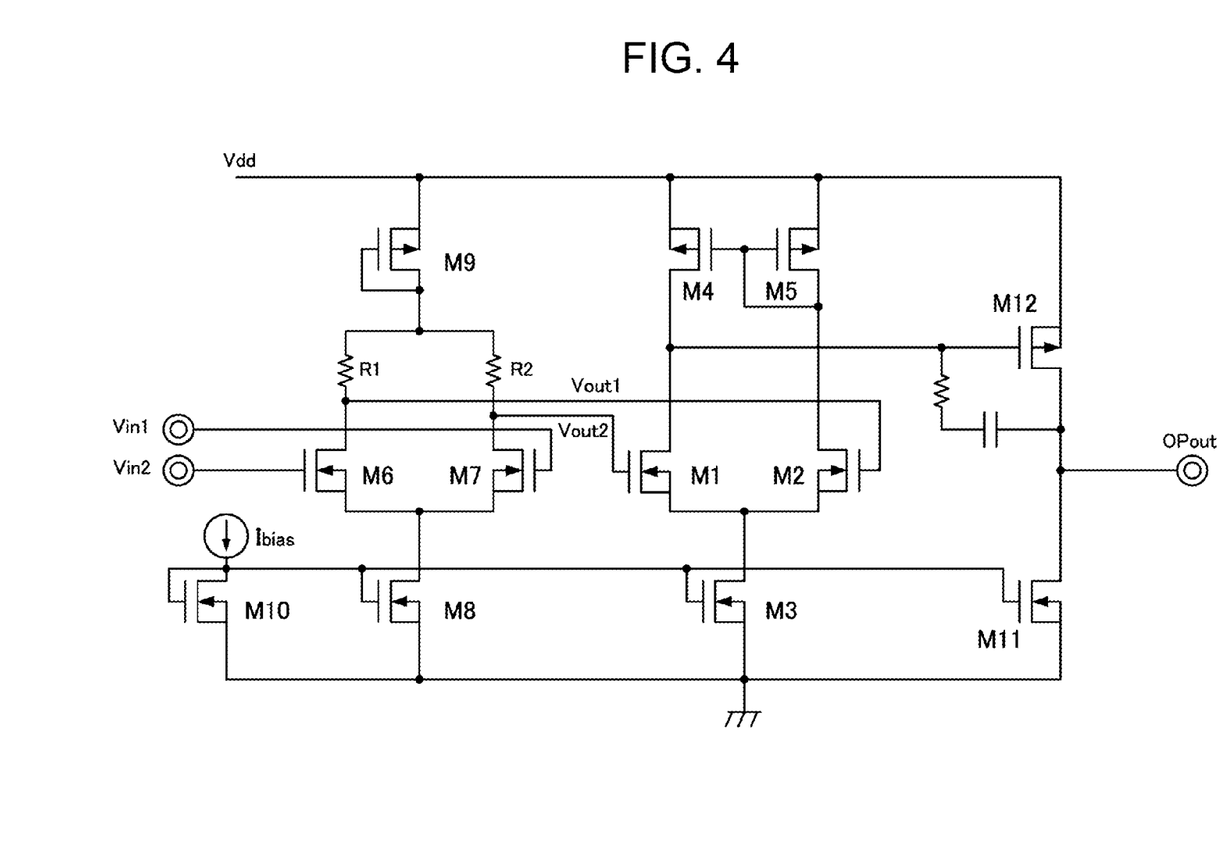
FIG. 4 is a circuit diagram schematically showing the configuration of a modification of the differential amplifier according to the first embodiment of the invention.

The invention is not limited to the foregoing embodiments. Here, each of the first transistor M1 to the third transistor M3 and the sixth transistor M6 to the eighth transistor M8 is formed with a P-MOS and each of the fourth transistor M4, the fifth transistor M5, the ninth transistor M9 and the tenth transistor M10 is formed with an N-MOS. However, as is shown in FIG. 4, a circuit diagram schematically showing the configuration of a modification of the differential amplifier according to the first embodiment of the invention, it is of course possible to form each of the first transistor M1 to the third transistor M3 and the sixth transistor M6 to the eighth transistor M8 with an N-MOS and form each of the fourth transistor M4, the fifth transistor M5, the ninth transistor M9 and the tenth transistor M10 with a P-MOS.

Moreover, it is of course also possible to adjust the resistance value r1 of the first resistor element R1 and the resistance value r2 of the second resistor element R2 in steps of a resistance value smaller than rb in a still greater number of steps. Furthermore, it is needless to say that the invention can be also similarly applied to the case in which the differential circuit section A is formed as a loopback cascode circuit. In addition, the invention can be variously modified to be carried out within a range without departing from the spirit and scope of the invention.

What is claimed is:

1. A differential amplifier comprising:
    a pair of input terminals;
    a differential circuit section carrying out differential amplification of voltages given in a pair;
    a gain circuit section amplifying an output of the differential circuit section and outputting the amplified output; and
    an offset voltage adjusting circuit section inserted between the differential circuit section and a pair of the input terminals, the offset voltage adjusting circuit section carrying out an adjustment so that a voltage equal to an offset voltage of the differential circuit section is added to an input voltage applied across the pair of the input terminals and giving the adjusted voltage to the differential circuit section;
    wherein the offset voltage adjusting circuit section comprises:
    sixth and seventh transistors forming a second differential pair;
    an eighth transistor forming a current source of the second differential pair;
    a ninth transistor forming a load of the second differential pair;
    a first resistor element inserted between the sixth transistor forming one of the second differential pair and the load; and
    a second resistor element inserted between the seventh transistor forming the other one of the second differential pair and the load,
    the first and second resistor elements giving a voltage equal to the offset voltage of the differential circuit section to the second differential pair.

2. The differential amplifier as claimed in claim 1 wherein the differential circuit section comprises:
    first and second transistors forming a first differential pair;
    a third transistor forming a current source of the first differential pair; and
    fourth and fifth transistors forming a current mirror circuit to be an active load of the first differential pair.

3. The differential amplifier as claimed in claim 2 wherein the offset voltage adjusting circuit section further comprises:
    a series connection of a plurality of resistor elements inserted between the sixth transistor and the seventh transistor with a resistance value of the connection equal to a sum of a resistance value of the first resistor element and a resistance value of the second resistor element; and
    a plurality of switches connected to connection points in the series connection to divide the series connection into a region equivalent to the first resistor element and a region equivalent to the second resistor element at a specified connection point of the connection points in the series connection and to selectively connect the specified connection point to the ninth transistor forming the load,
    the offset voltage adjusting circuit section forming the first resistor element and the second resistor element.

4. The differential amplifier as claimed in claim 3 wherein the plurality of the switches are formed of a plurality of transistors selectively turned on and turned off by external switches.

5. The differential amplifier as claimed in claim 2 wherein each of the first, second, third, sixth, seventh and eighth transistors is formed of a P-channel MOS-FET, and each of the fourth, fifth and ninth transistors is formed of an N-channel MOS-FET.

6. The differential amplifier as claimed in claim 2 wherein each of the first, second, third, sixth, seventh and eighth transistors is formed of an N-channel MOS-FET, and each of the fourth, fifth and ninth transistors is formed of a P-channel MOS-FET.

7. The differential amplifier as claimed in claim 4 wherein each of the plurality of the transistors forming the plurality of the switches is formed of an N-channel MOS-FET.

8. The differential amplifier as claimed in claim 4 wherein each of the plurality of the transistors forming the plurality of the switches is formed of a P-channel MOS-FET.

9. An apparatus, comprising:
    a resistance adjusting device configured to selectively place a resistance value at a point between a pair of connected differential transistors by switchably connecting discrete resistances together in series;
    wherein the resistance adjusting device comprises a plurality of stages of switches connected to points between the discrete resistances; and
    wherein each stage comprises a number of switches, and the number of the switches of each stage decreases from a first stage connected directly to the points between the discrete resistances to a subsequent stage connected to a preceding stage.

10. The apparatus of claim 9, wherein the plurality of stages of switches comprises four stages arranged as an inverse pyramid circuit.

11. The apparatus of claim 9, further comprising:
a differential circuit device coupled to the resistance adjusting device, the differential circuit device configured to carry out amplification of an input voltage;
wherein the resistance adjusting device is configured to selectively place the resistance value at the point between the pair of connected differential transistors so that a voltage substantially equal to an offset voltage of the differential circuit device is added to the input voltage.

* * * * *